Oct. 20, 1964 D. M. LEAKEY 3,153,729

TRANSISTOR GATING CIRCUITS

Filed Dec. 14, 1960

INVENTOR
DAVID MARTIN LEAKEY
BY Kirschstein, Kirschstein & Ottinger
ATTORNEYS

United States Patent Office 3,153,729
Patented Oct. 20, 1964

3,153,729

TRANSISTOR GATING CIRCUITS

David Martin Leakey, Ruislip, England, assignor to The General Electric Company Limited, London, England
Filed Dec. 14, 1960, Ser. No. 75,803
Claims priority, application Great Britain, Dec. 18, 1959, 43,103/59
5 Claims. (Cl. 307—88.5)

This invention relates to electric gating circuits.

It is an object of the present invention to provide an improved electric gating circuit which is efficient yet is of a basically simple form.

According to the present invention an electric gating circuit comprises a transistor having emitter, base and collector electrodes, a rectifier which is connected between the emitter and base electrodes with its direction of forward conduction between those electrodes opposite to that of the emitter-to-base rectifier in the transistor, a signal input path for applying input signals between the emitter and base electrodes, a gating signal input path, and a current path which is connected to the input path in shunt with the emitter-to-base rectifier in the transistor and which has an impedance that is dependent upon whether or not a gating signal is applied to the gating signal input path, the arrangement being such that while, on the one hand, no gating signal is applied to the gating signal input path the first-mentioned rectifier is conductive to maintain the transistor non-conducting irrespective of said input signals applied between the emitter and base electrodes, and while, on the other hand, a gating signal is applied to said gating signal input path said first-mentioned rectifier is non-conductive so as to allow the transistor to conduct in dependence upon said input signals.

Two electric gating circuits which are both in accordance with the present invention will now be described, by way of example, with reference to the accompanying drawings in which.

Figure 1:
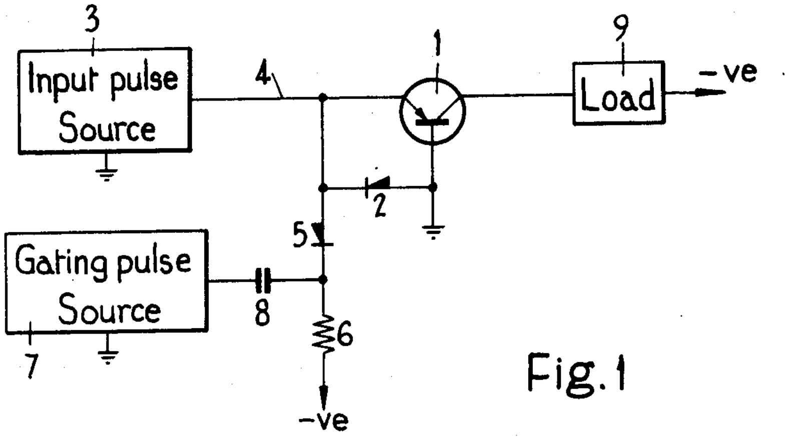
FIGURE 1 is a circuit diagram of a first of the two gating circuits.

Referring to FIGURE 1, the first gating circuit includes a P-N-P junction transistor 1 the base electrode of which is connected directly to earth. A rectifier 2 is connected directly between the base and emitter electrodes of the transistor 1 so that the direction of forward conduction of the rectifier 2 is opposite to that of the base-to-emitter rectifier in the transistor 1.

Positive-going input pulses to be gated by the gating circuit are applied between the emitter and base electrodes of the transistor 1 from an input pulse source 3, this pulse source being connected to the emitter electrode by a lead 4. A rectifier 5 and a resistor 6 are connected in series between the lead 4 and a negative voltage bias source so as to provide a current path in shunt with the emitter-to-base rectifier in the transistor 1. A gating pulse source 7 is connected, through a capacitor 8, to the junction of the rectifier 5 and the resistor 6 to apply positive-going gating pulses to the rectifier 5.

A load 9 is connected in the collector electrode circuit of the transistor 1 to utilise those of the input pulses from the pulse source 3 which are gated by the gating pulses from the source 7.

While no gating pulse is being applied to the rectifier 5 from the source 7, the two rectifiers 2 and 5 conduct and the transistor 1 is non-conducting. The current which flows through the rectifier 2 results in the application of a reverse voltage to the emitter-to-base rectifier in the transistor 1 so as to maintain the transistor 1 non-conducting. The rectifier 2 conducts to maintain the transistor 1 non-conducting irrespective of the application of input pulses over the lead 4, since the current which flows through the rectifier 5 is of larger magnitude than the maximum current which flows in the lead 4 due to the input pulses.

The application of a gating pulse to the rectifier 5 causes the rectifier 5 to become non-conducting. As a consequence, the rectifier 2 ceases to conduct also, so that a reverse voltage is no longer applied to the base-to-emitter rectifier in the transistor 1. Thus any input pulse applied over the lead 4 concurrently with the application of the gating pulse, causes the transistor 1 to conduct so that this input pulse is thereby transmitted hrough the transistor 1 to the load 9.

The voltage change at the emitter electrode of the transistor 1 which is required to cause the transistor 1 to conduct, is equal to the difference between the respective voltages that are necessary to forward bias the rectifier 2 and the transistor 1. This difference is small so that the amplitude of the gating pulse required to effect the gating operation is similarly small. For example, in one circuit constructed as shown in FIGURE 1 the voltage change required at the emitter electrode of the transistor 1 is approximately 0.8 volt, so that a gating pulse amplitude of only one volt has been found adequate to ensure reliable operation.

It is desirable that the rectifier 5 should exhibit low hole-storage properties, so that there shall not be any spurious output signal to the load 9, or interference with the waveform of any input signal from the source 3, consequent upon the flow of current in the reverse direction through the rectifier 5 when a gating pulse is applied from the source 7.

Figure 2:
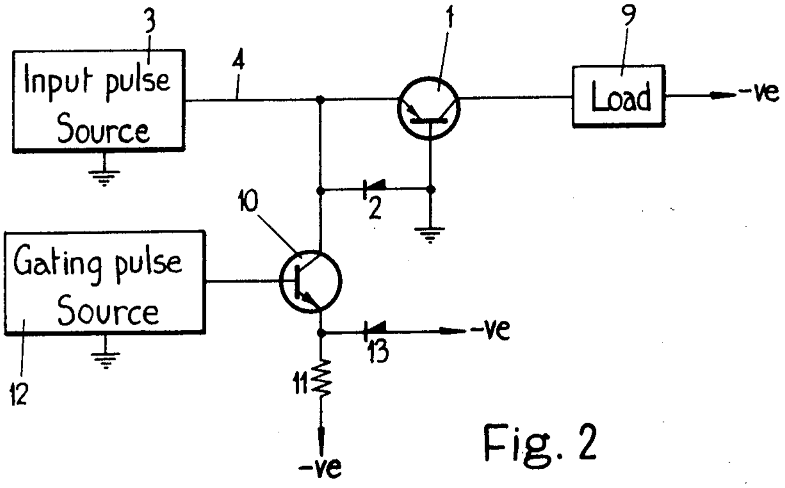
FIGURE 2 is a circuit diagram of the second gating circuit, this latter circuit being a modified form of the circuit shown in FIGURE 1.

In order to reduce the power required of the gating pulse source, the gating circuit of FIGURE 1 may be modified as shown in FIGURE 2. The same reference numerals are used in FIGURE 2 as in FIGURE 1 for those components of the gating circuit of FIGURE 1 that remain unchanged by the modification.

Referring to FIGURE 2, the current path which is in shunt with the emitter-to-base rectifier of the transistor 1 in this case, includes the emitter-to-collector path of an N-P-N junction transistor 10, and a resistor 11. A gating pulse source 12 is connected to the base electrode of the transistor 10 to apply negative-going gating pulses to this base electrode.

The gating pulses from the source 12 each have an amplitude of one volt and cause the transistor 10, which normally conducts, to become non-conductive. Thus when a gating pulse is applied from the gating pulse source 12 to the transistor 10 there is a consequent rise in impedance of the emitter-to-collector path of the transistor 10, with the result that the rectifier 2 ceases to conduct. Input pulses which are applied over the lead 4 from the source 3 concurrently with the application of gating pulses to the transistor 10 from the source 12, therefore pass to the load 9. The normal conduction of the transistor 10 while no gating pulse is applied from the gating pulse source 12, maintains a reverse voltage across the emitter-to-base rectifier in the transistor 1 so that input pulses from the source 3 do not then pass to the load 9.

A rectifier 13 is connected between the emitter electrode of the transistor 10 and an appropriate negative bias source, so as to prevent the potential of the emitter electrode of the transistor 10 becoming more than one-half volt more negative than the normal potential at the base electrode.

I claim:

1. An electric gating circuit comprising a transistor having emitter, base and collector electrodes, a rectifier connected between the emitter and base electrodes with its direction of forward conduction between those electrodes opposite to the direction of forward conduction in the transistor between the emitter and base electrodes, a signal input path for applying input signals to the emitter electrode of the transistor, means to maintain the base electrode of the transistor at a fixed potential, a source of gating signals, a variable-impedance network responsive to any said gating signals to present an increased impedance during a gating signal, a source of direct current, means connecting said variable-impedance network between said input path and said source of direct current so that in the absence of a gating signal the rectifier is forward biased and the transistor is reverse biased by said source, while upon the occurrence of a gating signal current flow through said rectifier ceases and the transistor conducts in dependence upon input signals supplied to the input path, and a utilization device connected in the collector electrode circuit of the transistor to respond to the simultaneous occurrence of a gating signal and an input signal supplied to the input path.

2. An electric gating circuit comprising a transistor having emitter, base and collector electrodes, a rectifier connected between the emitter and base electrodes with its direction of forward conduction between those electrodes opposite to the direction of forward conduction in the transistor between the emitter and base elecrodes, a signal input path for applying input signals between the emitter and base electrodes of the transistor, a source of gating signals, a variable-impedance network responsive to any said gating signal to present an increased impedance during said gating signal, a pair of supply lines, means to maintain a potential difference between said supply lines, and means connecting the variable-impedance network in series with the rectifier between said supply lines to provide a path both for current flowing in the input path and for current flow through said rectifier such that the emitter-base path of the transistor is reverse-biased until such time as a said gating signal is supplied by said source whereupon current flow through the rectifier ceases and the transistor conducts in dependence upon input signals supplied to the input path.

3. An electric gating circuit comprising: a transistor having emitter, base and collector electrodes; a first rectifier connected between the emitter and base electrodes with its direction of forward conduction between those electrodes opposite to the direction of forward conduction in the transistor between the emitter and base electrodes; a signal input path for applying input signals between the emitter and base electrodes of the transistor; a pair of supply lines; means to maintain a potential difference between said supply lines; a variable impedance network connected in series with said first rectifier between said supply lines to provide a path both for current flowing in the input path and for current flow through the first rectifier such that the emitter-base path of the transistor is reverse-biased, the variable-impedance network including a second rectifier biased to draw current through the first rectifier; and a gating signal supply source to supply gating signals to the variable-impedance network to render said second rectifier non-conductive during each said gating signal such that current flow through the first rectifier ceases and the transistor conducts in dependence upon input signals supplied to the input path.

4. An electric gating circuit comprising a transistor having emitter, base and collector electrodes, a first rectifier connected between the emitter and base electrodes with its direction of forward conduction between those electrodes opposite to the direction of forward conduction in the transistor between the emitter and base electrodes, a signal input path for applying input signals between the emitter and base electrodes of the transistor, a pair of supply lines, means to maintain a potential difference between said supply lines, a variable impedance network comprising a resistive element and a second rectifier connected in series with one another, means connecting said variable-impedance network in series with the first rectifier between said supply lines to provide a path both for current flowing in the input path and for current flow through the first rectifier such that the emitter-base path of the transistor is reverse-biased, and a gating signal supply path connected to the variable-impedance network intermediate the resistive element and the second rectifier for supplying gating signals to render the second rectifier non-conductive.

5. An electric gating circuit comprising a first transistor having emitter, base and collector electrodes, a rectifier connected between the emitter and base electrodes with its direction of forward conduction between those electrodes opposite to the direction of forward conduction in the transistor between the emitter and base electrodes, a signal input path for applying input signals between the emitter and base electrodes of the first transistor, a pair of supply lines, means to maintain a potential difference between said supply lines, a second transistor having emitter, base and collector electrodes, means connecting the emitter-to-collector current path of the second transistor in series with the rectifier between said supply lines to provide a path both for current flowing in the input path and for current flow through said rectifier such that the base-emitter path of the first transistor is reverse-biased, and a gating signal source to supply gating signals to the base electrode of the second transistor to render the second transistor non-conductive during each said gating signal such that current flow through the rectifier ceases and the first transistor conducts in dependence upon input signals supplied to the input path.

References Cited in the file of this patent

UNITED STATES PATENTS

| | | |
|---|---|---|
| 2,705,287 | Lo | Mar. 29, 1955 |
| 2,850,647 | Fleisher | Sept. 2, 1958 |
| 2,879,411 | Faulkner | Mar. 24, 1959 |
| 2,956,175 | Bothwell | Oct. 11, 1960 |
| 3,061,671 | Waller | Oct. 30, 1962 |